(12) United States Patent
Yoo et al.

(10) Patent No.: US 10,840,118 B2
(45) Date of Patent: Nov. 17, 2020

(54) SUBSTRATE PROCESSING APPARATUS AND METHOD FOR ASSEMBLING TUBE ASSEMBLY

(71) Applicant: EUGENE TECHNOLOGY CO., LTD., Yongin-Si (KR)

(72) Inventors: Cha Young Yoo, Suwon-Si (KR); Sung Tae Je, Yongin-Si (KR); Kyu Jin Choi, Yongin-Si (KR); Ja Dae Ku, Suwon-Si (KR); Jun Kim, Yongin-Si (KR); Bong Ju Jung, Hwaseong-Si (KR); Kyung Seok Park, Hwaseong-Si (KR); Yong Ki Kim, Osan-Si (KR); Jae Woo Kim, Bucheon-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 209 days.

(21) Appl. No.: 15/772,040

(22) PCT Filed: Sep. 5, 2016

(86) PCT No.: PCT/KR2016/009922
§ 371 (c)(1),
(2) Date: Apr. 27, 2018

(87) PCT Pub. No.: WO2017/073901
PCT Pub. Date: May 4, 2017

(65) Prior Publication Data
US 2018/0240696 A1 Aug. 23, 2018

(30) Foreign Application Priority Data

Oct. 27, 2015 (KR) .................. 10-2015-0149572

(51) Int. Cl.
*C23C 16/40* (2006.01)
*H01L 21/677* (2006.01)
(Continued)

(52) U.S. Cl.
CPC .... *H01L 21/67757* (2013.01); *C23C 16/4583* (2013.01); *C23C 16/4584* (2013.01);
(Continued)

(58) Field of Classification Search
CPC ......... H01L 21/67757; H01L 21/67346; H01L 21/67309; H01L 21/68785;
(Continued)

(56) References Cited

U.S. PATENT DOCUMENTS 6,204,194 B1 * 3/2001 Takagi ................ C23C 16/4412
257/E21.279
7,484,958 B2 * 2/2009 Kobayashi ........ H01L 21/67309
211/41.18

FOREIGN PATENT DOCUMENTS

JP H06338472 A 12/1994
JP H10242057 A 9/1998
(Continued)

OTHER PUBLICATIONS

International Search Report for PCT/KR2016/009922 dated Nov. 29, 2016.
Written Opinion for PCT/KR2016/009922 dated Nov. 29, 2016.

*Primary Examiner* — Rudy Zervigon
(74) *Attorney, Agent, or Firm* — Renaissance IP Law Group LLP

(57) ABSTRACT

In accordance with an exemplary embodiment, a substrate processing apparatus includes: a tube assembly having an inner space in which substrates are processed and assembled by laminating a plurality of laminates, a substrate holder configured to support the plurality of substrates in a multi-stage manner in the inner space of the tube assembly, a gas supply unit installed on one side of the tube assembly to supply a process gas to each of the plurality of substrates in the inner space; and an exhaust unit connected to the tube assembly to exhaust the process gas supplied into the inner
(Continued)

space, the substrate processing apparatus that induces a laminar flow to supply a uniform amount of process gas to a top surface of the substrate.

8 Claims, 5 Drawing Sheets

(51) Int. Cl.
  *H01L 21/673* (2006.01)
  *C23C 16/455* (2006.01)
  *C23C 16/458* (2006.01)
  *H01L 21/687* (2006.01)

(52) U.S. Cl.
  CPC .. *C23C 16/45504* (2013.01); *C23C 16/45578* (2013.01); *H01L 21/67309* (2013.01); *H01L 21/67326* (2013.01); *H01L 21/67346* (2013.01); *H01L 21/67742* (2013.01); *H01L 21/68771* (2013.01); *H01L 21/68785* (2013.01)

(58) Field of Classification Search
  CPC ......... H01L 21/68771; H01L 21/67742; H01L 21/67326; H01L 2021/60187; H01L 21/683; H01L 21/205; H01L 21/0228; H01L 21/67155; H01L 21/67161; H01L 21/67167; H01L 21/67173; H01L 21/67178; H01L 21/67184; H01L 21/6719; H01L 21/67196; H01L 21/67201; H01L 21/67207; H01L 21/67236; C23C 16/45504; C23C 16/4584; C23C 16/45578; C23C 16/4583; C23C 16/4412; C23C 16/45574; C23C 16/45563
  USPC ........................ 118/719; 156/345.31, 345.32
  See application file for complete search history.

(56) References Cited

FOREIGN PATENT DOCUMENTS

| JP | 2004162114 A | 6/2004 |
|---|---|---|
| JP | 2005276850 A | 10/2005 |
| JP | 2008166321 A | 7/2008 |
| JP | 2009004642 A | 1/2009 |
| JP | 2011512031 A | 4/2011 |
| JP | 2015508456 A | 3/2015 |
| KR | 19990077350 A | 10/1999 |
| KR | 20110100799 A | 9/2011 |
| KR | 101390474 B1 | 5/2014 |
| KR | 101463592 B1 | 11/2014 |

* cited by examiner

US 10,840,118 B2

SUBSTRATE PROCESSING APPARATUS AND METHOD FOR ASSEMBLING TUBE ASSEMBLY

TECHNICAL FIELD

The present disclosure relates to a substrate processing apparatus and a method for assembling a tube assembly, and more particularly, to a substrate processing apparatus that induces a laminar flow to supply a uniform amount of process gas to a top surface of a substrate and a method for assembling a tube assembly.

BACKGROUND

In general, a substrate processing apparatus is classified into a single wafer type substrate processing apparatus, which is capable of performing a substrate processing process on one substrate, and a batch type substrate processing apparatus, which is capable of performing a substrate processing process on a plurality of substrates at the same time. Such a single wafer type substrate processing apparatus has a simple structure, but has low productivity. Thus, the batch type substrate processing apparatus capable of being mass-producing substrates is being widely used.

The batch type substrate processing apparatus includes a processing chamber in which substrates horizontally laminated in a multistage manner are accommodated, a process gas supply nozzle for supplying a process gas into the processing chamber, and an exhaust line through which the gas in the processing chamber is exhausted. The substrate processing process using the batch type substrate processing apparatus is performed as follows. First, a plurality of substrates are loaded into the processing chamber. Then, while a gas within the processing chamber is exhausted through the exhaust line, a process gas is supplied into the processing chamber through the process gas supply nozzle. The process gas injected from the process gas supply nozzle is introduced into the exhaust line through an exhaust hole while passing between the substrates to form a thin film on each of the substrates.

Here, in order to form a thin film having a uniform thickness on the top surface of the substrate, it is important to divide a space in which each substrate is processed to induce a laminar flow of the process gas. However, in the case of the substrate processing apparatus according to the related art, it may be difficult to divide the space in which the substrates are processed, and thus, the laminar flow of the process gas may not be effectively induced. Thus, a uniform amount of process gas may not be supplied to the top surface of the substrate to deteriorate quality of the thin film.

In addition, since an amount of process gas passing through a circumference and a bottom surface of the substrate in the process gas is large, an amount of process gas supplied to the top surface of the substrate to actually participate in the substrate processing process may be small. Thus, the process gas may be wasted, and efficiency of the substrate processing process may be deteriorated.

Technical Problem

The present disclosure provides a substrate processing apparatus capable of inducing a laminar flow of a process gas and a method for assembling a tube assembly.

The present disclosure also provides a substrate processing apparatus capable of improving efficiency of a substrate processing process and a method for assembling a tube assembly.

Technical Solution

In accordance with an exemplary embodiment, a substrate processing apparatus includes: a tube assembly having an inner space in which substrates are processed and assembled by laminating a plurality of laminates; a substrate holder configured to support the plurality of substrates in a multi-stage manner in the inner space of the tube assembly; a gas supply unit installed on one side of the tube assembly to supply a process gas to each of the plurality of substrates in the inner space; and an exhaust unit connected to the tube assembly to exhaust the process gas supplied into the inner space.

Each of the laminates may include: a plate having a surface area; a hollow part provided in a central portion of the plate so that the substrate holder is movable; and protrusion parts, each of which protrudes from at least one surface of a first surface and a second surface, which face each other, on a portion of a circumference of the plate, wherein, when the plurality of laminates are laminated, the protrusion parts may support the plates so that the plates are spaced apart from each other.

The gas supply unit may be disposed on one side of the plate, and the protrusion parts may include: a pair of first protrusion members spaced apart from each other on both sides of the plate in a direction crossing an injection direction of the process gas to inject a flow of the process gas from one side to the other side of the plate; and a second protrusion member connected to the first protrusion members and disposed on the other side of the plate.

Each of the laminates may further include an exhaust hole defined in the plate to exhaust the process gas between the hollow part and the second protrusion member, and the exhaust holes of the plurality of laminates may be disposed in a line to provide a path through which the process gas is exhausted.

A plurality of isolation plates configured to divide a processing space in which each of the substrates is processed may be disposed on the substrate holder, and the isolation plates may be disposed to correspond to the plate in a horizontal direction.

A path through which the process gas is supplied may be provided in each of the protrusion parts, and the laminate may further include a plurality of injection holes defined in an inner wall of the protrusion part to inject the process gas to the substrates and communicating with the path within the protrusion part.

An insertion part may be provided in the protrusion part, and the tube assembly may further include a fixing bar inserted into the insertion part to fix the laminates.

At least a portion of the protrusion parts of the plurality of laminates may have a different thickness.

The tube assembly may further include one or more height adjustment members installed between the protrusion parts of the plurality of laminates.

In accordance with another exemplary embodiment, a method for assembling a tube assembly that forming an inner process in which a plurality of substrates are processed includes: inserting a plurality of laminates into an alignment bar extending in a vertical direction; inserting a fixing bar into the plurality of laminates; and separating the alignment bar from the laminates, wherein the alignment bar is softer than each of the laminate, and the fixing bar is harder than the alignment bar.

The fixing bar may be made of the same material as the laminate.

Advantageous Effects

In accordance with the exemplary embodiment, a plurality of laminates may be laminated to form a path through which a process gas flows in one direction. Therefore, a space in which the process gas is spread may be reduced to concentratedly supply the process gas to a top surface of a substrate. Thus, an amount of process gas supplied to the substrate to actually participate in the substrate processing process may increase to reduce a waste of the process gas and improve an efficiency of the substrate processing process.

Also, a laminar flow of the process gas supplied to the substrate may be induced. Therefore, the process gas may be supplied in parallel to the top surface of the substrate and thus be uniformly supplied to an entire top surface of the substrate. Thus, the thin film having an uniform thickness may be formed on the top surface of the substrate to improve the quality of the thin film.

DETAILED DESCRIPTION

Figure 1:
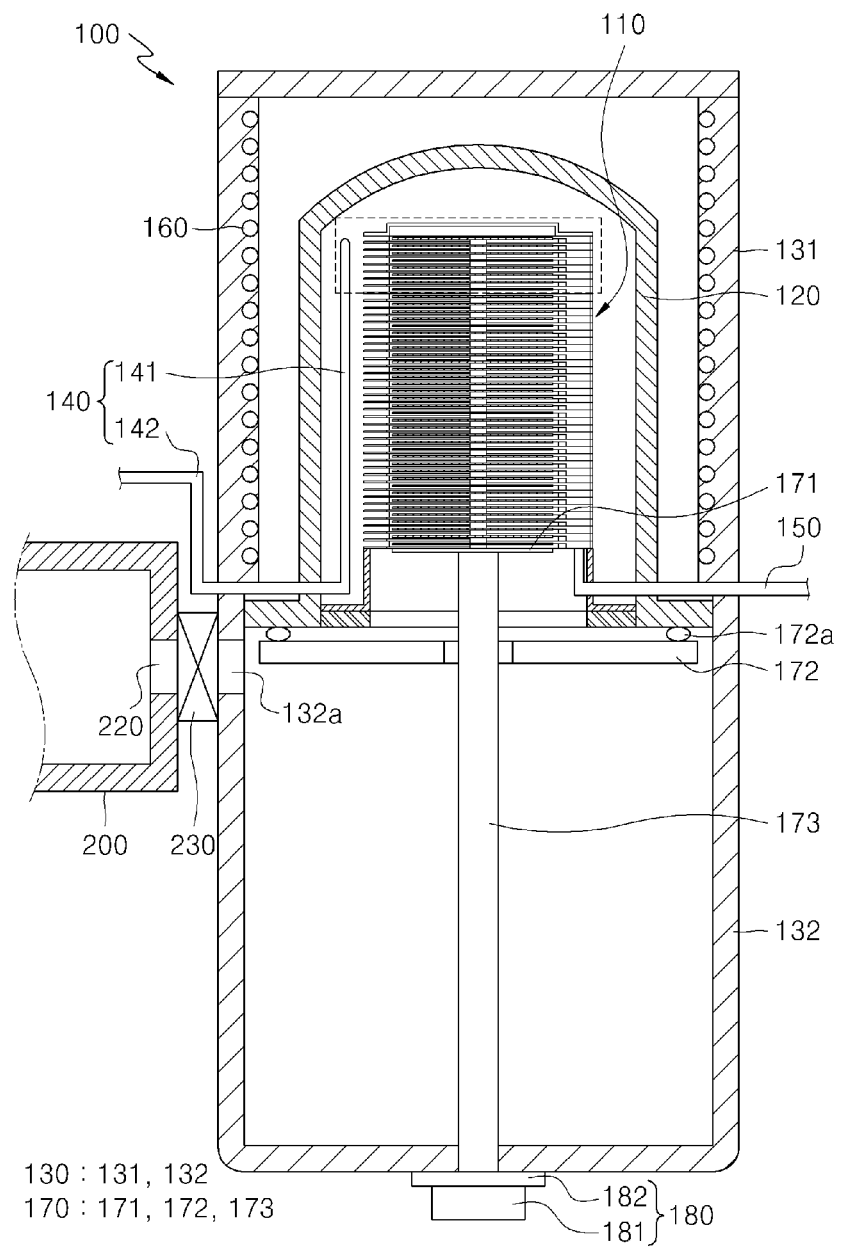
FIG. 1 is a view of a substrate processing apparatus in accordance with an exemplary embodiment.

Hereinafter, embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the figures, the dimensions of layers and regions are exaggerated for clarity of illustration. Like reference numerals refer to like elements throughout.

Figure 2:
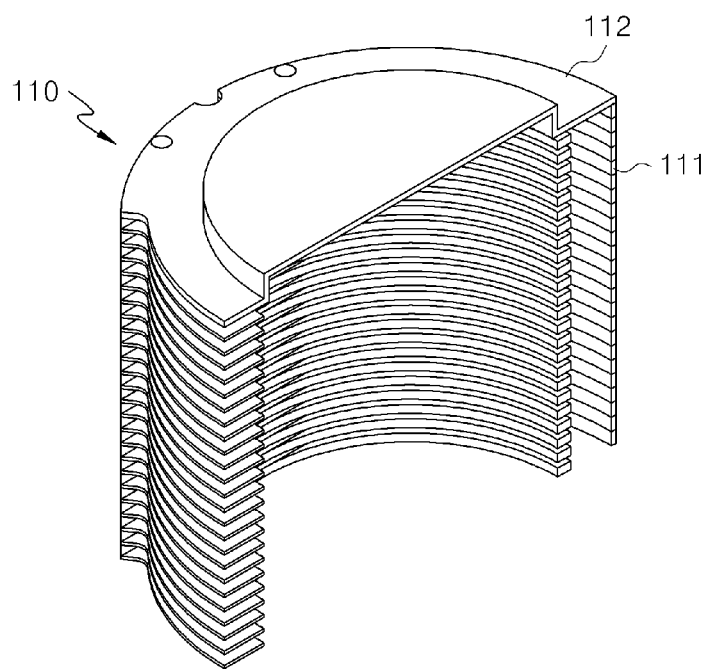
FIG. 2 is a perspective view of a tube assembly in accordance with an exemplary embodiment.
Figure 3:
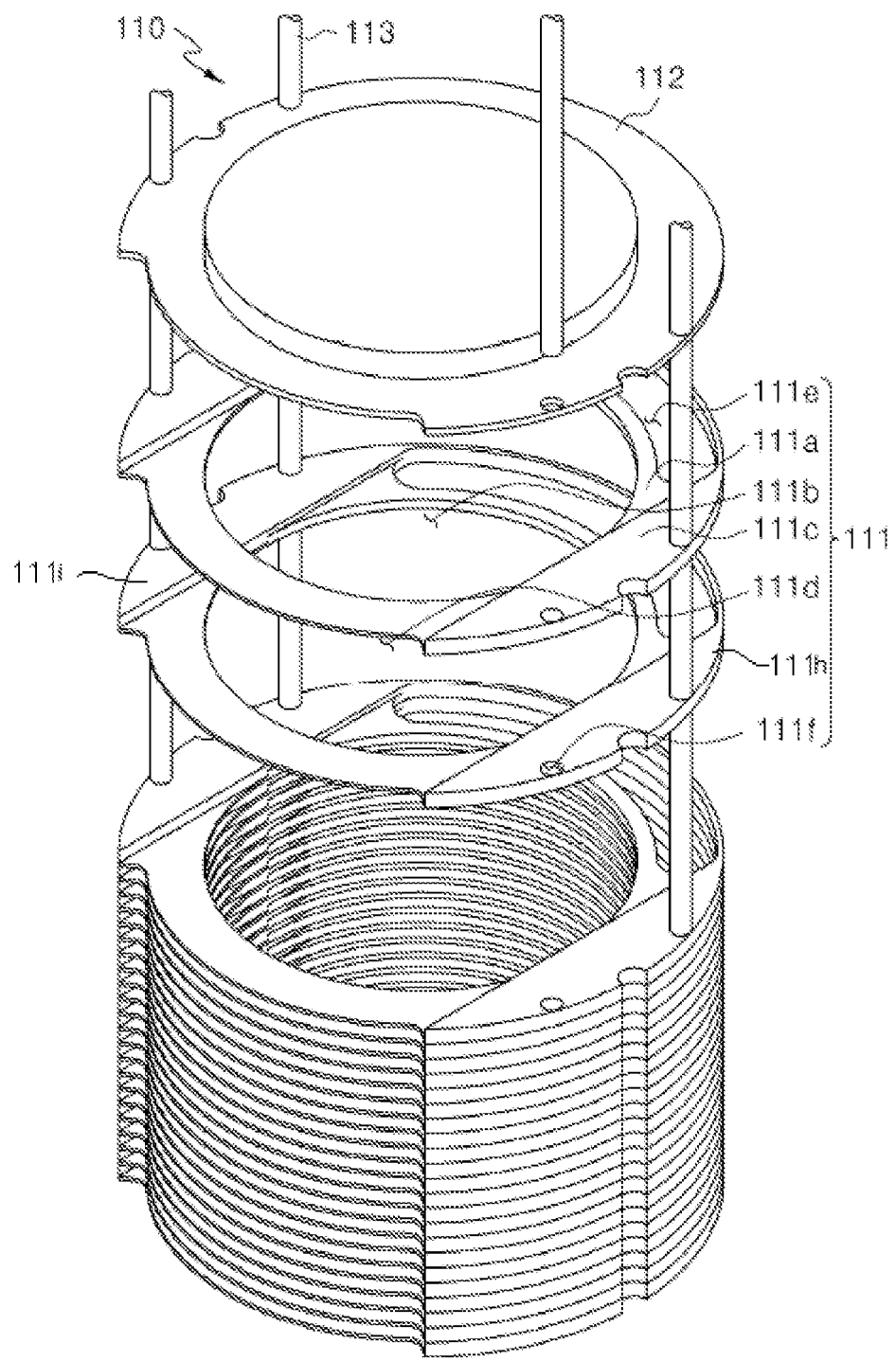
FIG. 3 is an exploded perspective view illustrating a structure of the tube assembly in accordance with an exemplary embodiment.
Figure 4:
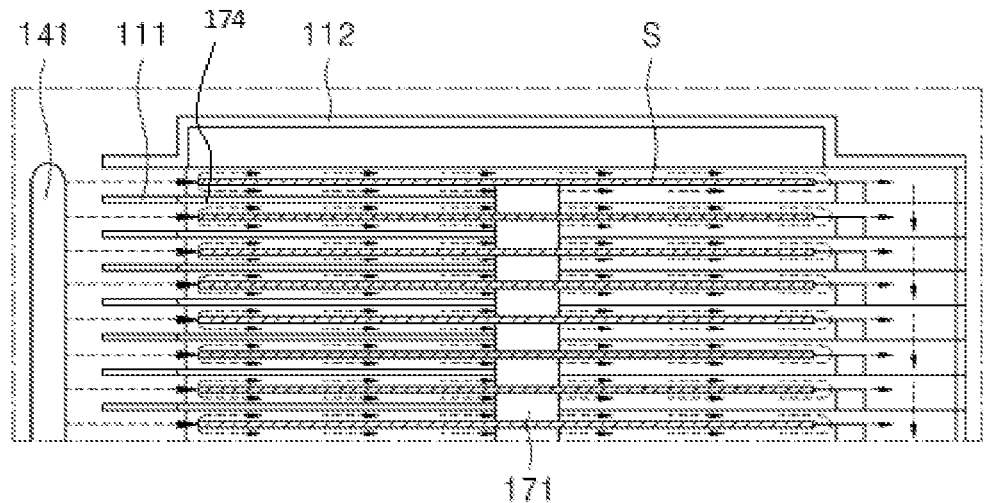
FIG. 4 is a view illustrating a flow of a process gas within the tube assembly in accordance with an exemplary embodiment.
Figure 5:
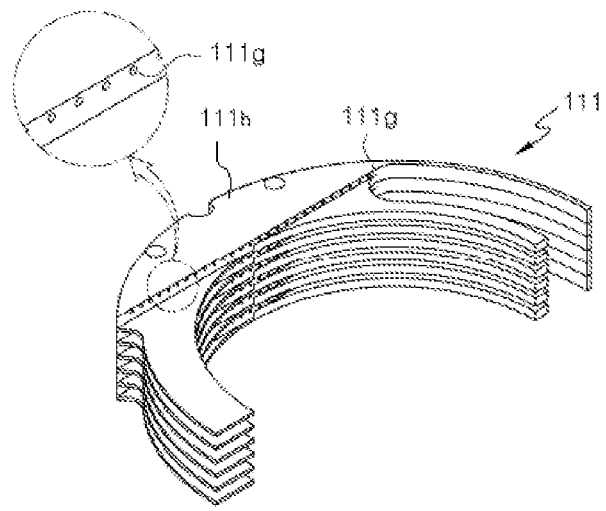
FIG. 5 is a view of a protrusion part in accordance with another exemplary embodiment.
Figure 6:
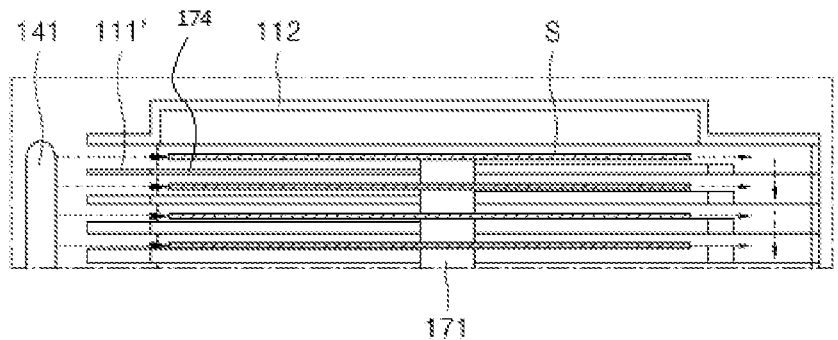
FIG. 6 is a view of a laminate in accordance with another exemplary embodiment.
Figure 7:
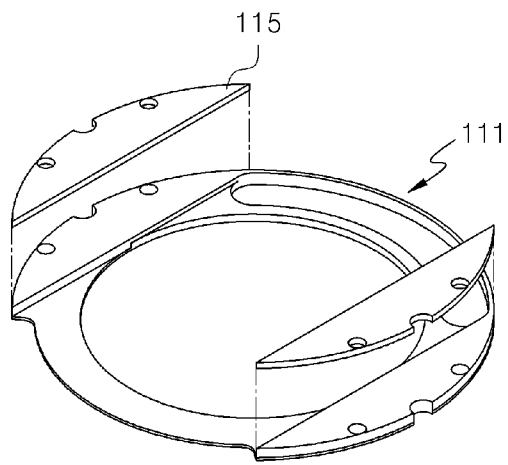
FIG. 7 is a view illustrating a structure of a laminate in accordance with further another exemplary embodiment.

FIG. 1 is a view of a substrate processing apparatus in accordance with an exemplary embodiment, FIG. 2 is a perspective view of a tube assembly in accordance with an exemplary embodiment, FIG. 3 is an exploded perspective view illustrating a structure of the tube assembly in accordance with an exemplary embodiment, FIG. 4 is a view illustrating a flow of a process gas within the tube assembly in accordance with an exemplary embodiment, FIG. 5 is a view of a protrusion part in accordance with another exemplary embodiment, FIG. 6 is a view of a laminate in accordance with another exemplary embodiment, and FIG. 7 is a view illustrating a structure of a laminate in accordance with further another exemplary embodiment.

Referring to FIGS. 1 and 2, a substrate processing apparatus 100 in accordance with an exemplary embodiment includes a tube assembly 110 having an inner space in which substrates S are processed and assembled by laminating a plurality of laminates 111, a substrate holder 171 supporting the plurality of substrates S in a multistage manner in the inner space of the tube assembly 100, a gas supply unit 140 installed on one side of the tube assembly 110 to supply a process gas to each of the plurality of substrates disposed in the inner space, and an exhaust unit connected to the tube assembly 110 to exhaust the process gas supplied into the inner space. Also, the substrate processing apparatus 100 may further include a chamber unit 130, an outer tube 120, a support unit 170 provided with the substrate holder 171, a driving unit 180, and a heating unit 160.

The chamber unit 130 may have a rectangular box or cylindrical shape. The chamber unit 130 may include an upper chamber 131 and a lower chamber 132. A lower portion of the upper chamber 131 and an upper portion of the lower chamber 132 are connected to each other. An entrance through which the substrates S are accessible may be provided in a side surface of the lower chamber 132. Thus, the substrates S may be loaded into the chamber unit 130 through the entrance. Also, the substrates S loaded into the lower chamber 132 may move upward to be processed within the upper chamber 131. Thus, the inside of the lower chamber 132 may provide a loading space in which the substrates S are loaded, and the inside of, the upper chamber 131 may provide a process space for the substrates S. However, an exemplary embodiment is not limited to the structure and shape of the chamber unit 130. For example, the chamber unit 130 may have various structures and shapes.

The outer tube 120 may have a cylindrical shape and be disposed above the lower chamber having an opened upper portion or within the upper chamber 131. The outer tube 120 has an inner space in which the tube assembly 110 is accommodated and has an opened lower portion. Here, an inner wall of the outer tube 120 and an outer wall of the tube assembly 110 may be spaced apart from each other to provide a space between the outer tube 120 and the tube assembly 110. However, an exemplary embodiment is not limited to the structure and shape of the outer tube 120. For example, the outer tube 120 may have various structures and shapes.

The support unit 170 may include the substrate holder 171, a blocking plate 172 for sealing the inside of the tube assembly 110, a shaft 173, and a plurality of isolation plates 174 respectively disposed between the substrates S in a loading direction of the substrates S to divide the inner space into processing spaces in which the plurality of substrates S are processed.

The substrate holder 171 is configured to load the plurality of substrates S in a vertical direction. The substrate holder 171 may include a plurality of support bars extending in the vertical direction and an upper plate connected to the support bars to support the support bard. A support tip for easily supporting the substrates S may protrude from each of the support bars to a center of the substrate S.

The upper plate may have a circular plate shape and have a diameter greater than that of the substrate S. Three support bars may be provided to be spaced apart from each other along a circumference of the upper plate and then be connected to an outer lower portion of the upper plate. The support tip may be provided in plurality to be spaced apart from each other in a line in the extension direction of the support bar. Thus, the substrate holder 171 may vertically provide a plurality of layers, on which the substrates S are loaded, and one substrate S may be loaded on one layer (or the processing space). However, an exemplary embodiment is not limited to the structure and shape of the substrate holder 171. For example, the substrate holder 171 may have various structures and shapes.

The blocking plate 172 may have a circular plate shape and a diameter greater than that of the substrate holder 171. The blocking plate 172 is connected to a lower portion of the substrate holder 171. Thus, when the substrate holder 171 moves from the lower chamber 132 into the tube assembly 110, the blocking plate 172 may also move upward together with the substrate holder 171 to close the opened lower portion of the tube assembly 110. Also, a sealing member 172*a* having an O-ring shape may be disposed between the blocking plate 172 and the outer tube 120 or between the blocking plate 172 and the tube assembly 110. Thus, when the processing process is performed on the substrate S, the inside of the tube assembly 110 may be sealed from the lower chamber 132 and prevent the process gas within the tube assembly 110 from being introduced into the lower chamber 132 or foreign substances within the lower chamber 132 from being introduced into the tube assembly 110. However, an exemplary embodiment is not limited to the structure and shape of the blocking plate 172. For example, the blocking plate 172 may have various structures and shapes.

The shaft 173 may have a bar shape that extends in the vertical direction. The shaft 173 may have an upper end connected to the blocking plate 172 and a lower end connected to the driving unit 180. Thus, the substrate holder 171 may rotate by the driving unit 180 with respect to a vertical central axis of the shaft 173 and vertically move by the driving unit 180 along the shaft 173.

The isolation plates 174 may have a circular plate shape and be provided in plurality to be respectively disposed on lower portions of the support tips. That is, the isolation plates 174 may be fitted into the support bars and disposed to be spaced apart from each other between the support tips. Thus, the isolation plates 174 may distinguish the processing spaces, in which the substrates S are processed, from each other. Thus, the processing space may be individually defined in each layers of the substrate holder 171.

The driving unit 180 may include a vertical driver 181 vertically moving the support unit 170 and a rotating driver 182 rotating the support unit 170.

The vertical driver 181 may be a cylinder and connected to the lower portion of the support unit 170, i.e., the shaft 173 to vertically move the support unit 170. Thus, the support unit 170 on which the substrate S is loaded may be vertically moved between the tube assembly 110 and the lower chamber 132. That is, when the vertical driver moves the support unit 170 downward, the substrates S may be seated on the support unit 170 through the entrance of the lower chamber 132. When all the substrate S are seated on the support unit 170, the vertical driver may move the support unit 170 into the tube assembly 110 disposed thereabove so that the processing space is performed on the substrates S.

The rotating driver 182 may be a motor and connected to the lower portion of the support unit 170, i.e., the shaft 173 to rotate the support unit 170. When the support unit 170 is rotated by using the rotating driver 182, the process gas moved to passing through the substrate S loaded on the support unit 170 may be mixed and thus uniformly distributed above the substrate S. Thus, a thin film deposited on the substrate S may be improved in quality. However, an exemplary embodiment is not limited to the above-described method for vertically moving or rotating the support unit 170 by using the driving unit 180. For example, the driving unit 180 may move or rotate the support unit 170 through various methods.

The heating unit 160 may be a heater disposed outside the outer tube 120. For example, the heating unit 160 may be inserted into and installed in the inner wall of the upper chamber 131 to surround a side surface and an upper portion of the outer tube 120. Thus, when the heating unit 160 generates heat energy, the heat energy may pass through the outer tube 120 to increase an inner temperature of the tube assembly 110. Thus, the heat unit 160 may be controlled so that the inner temperature of the tube assembly 110 is adjusted to a temperature at which the substrate S is easily processed. However, an exemplary embodiment is not limited to the installation position of the heating unit 160. For example, the heating unit 160 may be disposed at various positions.

The gas supply unit 140 may include a plurality of injection nozzles 141 injecting the process gas to the substrate S disposed in the tube assembly 110 and a process gas supply line 142 connected to the injection nozzles 141 to supply the process gas.

The injection nozzles 141 may be arranged in a line along the circumference of the substrate S to surround a portion of the substrate S at one side of the tube assembly 110. Also, the injection nozzles 141 may extend in the vertical direction, and a plurality of injection holes may be defined to be spaced apart from each other in the vertical direction. Thus, the injection nozzles 141 may inject the process gas into the processing spaces, in which the substrates S are processed and which are divided by the isolation plates 174 and a plurality of plates 111*a* of the tube assembly 110, which will be described later.

The process gas supply line 142 may have a pipe shape and have one end connected to the injection nozzles 141 and the other end connected to a process gas supply source (not shown). Thus, the process gas supplied from the process gas supply source may be supplied into the injection nozzles 141 through the process gas supply line 142. Also, the process gas supply source may be provided in plurality to separately store a source gas, an etch gas, a dopant gas, and a carrier gas. The gases may be mixed at various ratios and supplied to the process gas supply line 142 to control a thickness of the thin film on the substrate S.

The process gas supply line 142 may be provided in plurality. Thus, the plurality of process gas supply lines 142 may be respectively connected to the injection nozzles 141, or one line may be branched into a plurality of lines and respectively connected to the injection nozzles 141. Also, one or plurality of control valves may be provided in the process gas supply line 142 to control an amount of process gas to be supplied to the injection nozzles 141. However, an exemplary embodiment is not limited to the structure and shape of the process gas supply line 142. For example, the process gas supply line 142 may have various structures and shapes.

The exhaust unit may include an exhaust line 150 for exhausting the gas suctioned into the exhaust hole 1112 of the tube assembly 110 to the outside of the tube assembly 110 and an suction unit (not shown) providing suction force to the exhaust line 150. The exhaust line 150 may have a pipe shape and have one end connected to the lowermost exhaust hole 111e of the plurality of exhaust holes 111e and the other end connected to the suction unit. Thus, the gas within the tube assembly 110 may be suctioned into the exhaust hole 111e by the suction force provided by the suction unit and then discharged to the outside of the tube assembly 110 along the exhaust line 150. Thus, since a separate duct for exhausting a gas is not provided, the equipment may be simplified and easily maintained and repaired. However, an exemplary embodiment is not limited to the structure and shape of the exhaust line 150. For example, the exhaust line 150 may have various structures and shapes.

The tube assembly 110 has an inner space in which the substrate S is accommodated and has an opened lower portion. Thus, the inside of the tube 110 may communicate with the inside of the lower chamber 132, and thus, the substrate S may move between the tube assembly 1110 and the lower chamber 132. Thus, when the substrate holder 171 is disposed in the lower chamber 132, the substrate S may be loaded, and the substrate holder 171 may move into the tube assembly 110 to perform the processing process on the substrate S.

Here, the substrate processing apparatus 100 in accordance with an exemplary embodiment may be an epitaxial apparatus for forming an epitaxial layer on the substrate S. When a selective epitaxial growth (SEG) process is performed on the substrate S, the process gas may be supplied into all the processing spaces. The process gas may include at least one of the source gas, the etch gas, the dopant gas, and the carrier gas, and the gases may be mixed at various ratios and supplied to control the thickness of the thin film on the substrate S.

Since the gases have molecular weights different from each other, a flow of the process gas may vary according to the ration of the gases. Thus, in the selective epitaxial growth, a flow of the process gas may be an important factor for determining the thickness and composition of the thin film on the substrate S.

For example, the process gas supplied from the gas supply unit 140 may be suctioned into the exhaust unit via the substrate S to generate a laminar flow. That is, the process gas supplied to a side surface of the substrate S may come into contact with the side surface of the substrate S to move along the top and bottom surfaces of the substrate S. Thus, since the process gas flows in parallel to the substrate S, the process gas may be uniformly supplied to the top surface of the substrate S. Thus, the tube assembly 110 in accordance with an exemplary embodiment may be provided to induce the laminar flow so that the process gas is uniformly supplied to the top surface of the substrate S.

Referring to FIGS. 2 and 3, a plurality of laminates 111 may be vertically laminated to form the tube assembly 110. Also, the tube assembly 110 may include a cover 112 covering an upper portion of the uppermost body of the plurality of laminates 111 and a fixing bar 113 fixing the plurality of tube assemblies 110. The tube assembly 110 may be seated on and fixed to an upper side of the lower chamber 132 and disposed within the upper chamber 131. In detail, the tube assembly 110 may be disposed within the outer tube 120 disposed within the upper chamber 131.

The laminate 111 may include a plate 111a having a surface area, a hollow part 112b provided in a central portion of the plate 111a to allow the substrate holder 171 to be movable, and a protrusion part 111c protruding from at least one surface of a first surface and a second surface, which face each other on a portion of a circumference of the plate 111a. The laminate 111 may further include a recess part 111f providing a space in which the injection nozzle 141 of the gas supply unit 140 is disposed, an exhaust hole 111e providing a path through which the process gas is exhausted, an insertion part 111f into which the fixing bar 113 is inserted, and an injection hole 111g defined in the protrusion part 111c to inject the process gas.

The plate 111a may have a circular plate shape having a predetermined surface area. The plurality of plates 111a are vertically spaced apart from each other. Also, a plurality of injection holes defined in the injection nozzles 141 are vertically disposed in a line to correspond to the spaces between the plates 111a. Thus, the path through which the process gas is injected may be provided between the plates 111a. Thus, a space in which the process gas injected from the injection nozzle 141 is spread by the plate 111a may be reduced, and thus, the process gas may be concentratedly injected onto the substrate S. However, an exemplary embodiment is not limited to the shape of the plate 111a. For example, the plate 111a may have various shapes.

The hollow part 111b may be provided in the central portion of the plate 111a and have a circular shape corresponding to a planar shape of the substrate holder 171. Also, the hollow part 111b may have, a diameter greater than that of the substrate holder 171. Thus, the substrate holder 171 may vertically move within the tube assembly 110 through the hollow part 111b. However, an exemplary embodiment is not limited to the shape of the hollow part 111b. For example, the hollow part 111b may have various shapes.

Here, the plate 111a may be disposed on the same line as the isolation plate 174 of the support unit 170 in a horizontal direction. That is, in the state in which the substrate holder 171 is disposed within the tube assembly 1110, the plate 111a and the isolation plate 174 may be disposed on the same line. Thus, the processing space in which each of the substrates S is processed and the moving path through which the process gas moves may be effectively distinguished by the plate 111a and the isolation plate 174. Thus, when the process gas is injected into the processing space for each substrate S, the process gas may not be spread, but be concentratedly supplied into the process space.

The protrusion part 111c may protrude from at least one surface of the first surface and the second surface, which face each other, on a portion of the circumference of the plate 111a. For example, the protrusion part 111c may protrude upward or downward from at least a portion of the top and bottom surfaces of the plate 111a. That is, when the laminates are vertically laminated, the protrusion parts 111c may be laminated to come into contact with each other. Thus, the plates 111a may be spaced apart from each other and supported by the protrusion parts 111c.

Also, the protrusion part 111c may include a pair of first protrusion members 111h and 111i spaced apart from each other on both sides of the plate 111a in a direction crossing the injection direction of the process gas to induce a flow of the process gas from one side to the other side of the plate 111a and a second protrusion member connected to the first protrusion members 111h and 111i and disposed on the other side of the plate 111a. Here, the injection nozzle 141 may be disposed at the front of the plate 111a to inject the process gas.

The first protrusion member may be provided in a pair of protrusion members 111h and 111i, and the pair of first protrusion members. 111h and 111i may be disposed to be spaced apart from each other on both the sides, of the plate 111a. For example, the first protrusion members 111h and 111i may be disposed on left and right sides of the plate 111a. The first protrusion members 111h and 111i may provide walls at left and right sides of the plate 111a in a direction parallel to the injection direction of the process gas, respectively.

Thus, the first protrusion members 111h and 111i may serve as partitions to allow the process injected from the injection nozzle 141 from one side to the other side of the plate 111a without being spread. That is, the first protrusion members 111h and 111i may induce the flow of the process gas to be parallel to the top surface of the substrate S so that the process gas is concentrated onto the top surface of the substrate S. Thus, an amount of process gas participating in the substrate processing process may increase to improve efficiency of the substrate processing process.

The second protrusion member may be disposed at the rear of the plate 111a. That is, the second protrusion member may be connected to the first protrusion members 111h and 111i to surround the side surface and the rear side of the plate. Thus, the protrusion part 111c may surround other portions except for the front side of the plate 111a, i.e., the portion from which the process gas is injected. Thus, since the protrusion part 111c seals the side surface and the rear side of the plate 111a to provide the path through which the process gas flows, the laminar flow of the process gas may be induced, and the process gas may be prevented from being discharged to the outside through the side surface and the rear side of the plate 111a. However, an exemplary embodiment is not limited to the structure and shape of the protrusion part 111c. For example, the protrusion part 111c may have various structures and shapes.

As described above, the protrusion part 111c may support the plate 111a and allows the plate 111a to be spaced therefrom and also control the flow of the process gas supplied to the substrate S. That is, since the wall defined by the first protrusion member 111h is parallel to the injection direction of the process gas, the process gas injected from the injection nozzle may move along the moving path defined by the first protrusion members 111h and 111i without being spread in left and right directions. Thus, an amount of process gas passing over the substrate S disposed on the moving path defined by the first protrusion members 111h and 111i may increase, and thus, an amount of process gas actually participating in the substrate processing process may increase.

Also, the moving path of the process gas, which is defined by the protrusion part 111c and the plate 111a may induce the flow of the process gas to be parallel to the top surface of the substrate S. Thus, when the process gas moves along the moving path defined by the protrusion part 111c and the plate 111a, the laminar flow may be smoothly induced to supply a uniform amount of process gas onto the entire top surface of the substrate S. Thus, the thin film having the uniform thickness may be formed.

A space into which the process gas is supplied may be defined in the protrusion part 111c, particularly, the first protrusion member 111h, and as illustrated in FIG. 5, a plurality of injection holes 111g may be defined in the protrusion part 111c, particularly, an inner wall of the first protrusion member 111h. For example, when 15 injection nozzles 151 are disposed in a line along the recess part 111d, the first injection nozzle the last injection nozzle may be connected to the inner space of the protrusion part 111c. Thus, the first and last injection nozzles may supply the process gas into the protrusion part 111c, and the second to fourteenth injection nozzles may inject the injection gas into the space between the plates 111a.

That is, the process gas injected to the substrate S may move along the circumference of the substrate S and the bottom surface of the substrate S in addition to the top surface of the substrate S. Thus, only a portion of the process gas supplied to the top surface of the substrate S may actually participate in the substrate processing process, and the other portion of the process gas may not actually participate in the substrate processing process.

Thus, the process gas may be injected to the front of the substrate S through the injection nozzles 141 and also injected from both sides of the substrate S through the injection holes 111g defined in the protrusion part 111c. Thus, the process gas injected from the injection holes 111g may induce the flow of the process gas injected from the injection nozzles 141 to the central portion of the substrate S, and thus, an amount of process gas participating in the substrate processing process may increase. However, an exemplary embodiment is not limited to the number of injection nozzles 141 and the method for supplying the process gas. For example, the number of injection nozzles 141 and the method for supplying the process gas may variously vary.

The recess part 111d may be recessed from the outer portion to a central portion of the plate 111a. The recess part 111d is disposed along the circumference of the plate 111a at the front of the plate 111a. Thus, the plurality of injection nozzles may be disposed in a line along the recess part 111d and the front circumference of the plate 111a, and the process gas may be injected into the space between the plates 111a, i.e., the processing space for each substrate S. However, an exemplary embodiment is not limited to the shape of the recess part 111d. For example, the recess part 111d may have various shapes.

The exhaust hole 111e may be defined in the rear of the plate 111a to correspond to the position of the recess part 11d so that the process gas is exhausted into the tube assembly 111. Also, the exhaust hole 111e may be provided between the hollow part 111b and the second protrusion member and have a crescent moon shape to correspond to the shape of the plate 111a. Thus, the process gas injected from the front of the plate 111a may move to the rear of the plate 111a and then be introduced into the exhaust hole 111e after reacting with the substrate S.

Also, when the laminates 111 are vertically laminated, the exhaust holes 111f may be vertically disposed in a line to communicate with each other. Thus, the plurality of exhaust holes 111f may provide a path through which the process gas is exhausted. Thus, when the exhaust line 150 is connected to one of the plurality of exhaust holes 111f, the suction force may be generated in the whole exhaust holes 111f to exhaust the process gas.

Also, the exhaust holes 111e may have different surface areas for each position. That is, since the exhaust line 150 is connected to the lowermost exhaust hole 111e of the exhaust holes 111e, a difference in suction force between the uppermost exhaust hole 111e and the lowermost exhaust hole 111e may occur. Thus, the exhaust hole 111e may have a width that gradually decreases downward. Thus, the upper exhaust hole 111e may control the suction force so that a uniform suction force is generated in the lower exhaust hole. However, an exemplary embodiment is not limited to the shape, surface area, and position of the exhaust hole 111e. For example, the exhaust hole 111e may have various shapes, surface areas, and positions.

A plurality of insertion parts 111f may be provided in the protrusion part 111c. For example, the insertion part 111f may have a hole shape or a shape that surrounds a portion of the fixing bar 113. Thus, when the plurality of laminates 111 are vertically laminated, the plurality of insertion parts 111f may be vertically disposed in a line to communicate with each other.

The fixing bar 113 may have a bar shape extending in the vertical direction and be provided in plurality. The plurality of fixing bars 113 may be respectively inserted into the plurality of insertion parts 111f to fix the laminates 111. The fixing bar 113 may extend beyond a height of the tube assembly 110 and be fixed to the insertion part 111f provided in the lowermost laminate 111 of the plurality of laminates 111. Thus, the fixing bar 113 may fix and connect the laminates 111 to each other. That is, when the plurality of laminates 111 are fixed by using one fixing bar, the laminates 111 may rotate around the fixing bar 113. Thus, the plurality of fixing bars 113 may be provided so that the hollow parts 111b of the laminates 111 are vertically disposed on the same line to prevent the laminates from rotating. However, an exemplary embodiment is not limited to the shape and the fixed portion of the fixing bar 113. For example, the chamber unit 130 may vary in shape and fixed portion.

The cover 112 covers an upper portion of the uppermost body of the plurality of laminates 111. The cover 112 may have a circular plate shape corresponding to that of the plate 111a, and a central portion of the cover 112 may further protrude upward than the outer portion. Thus, a space in which the substrate S is processed may be defined between the cover 112 and the uppermost laminate 111. The cover 112 may cover the upper portion of the laminate 111 to prevent the process gas injected into the space between the cover 112 and the uppermost laminate 111 from leaking to the outside.

Also, a hole corresponding to the insertion part 111f of the laminate 111 may be defined in the cover 112 to connect the cover 112 to the laminate 112 by the fixing bar 113. However, an exemplary embodiment is not limited to the structure and shape of the cover 112. For example, the cover 112 may have various structures and shapes.

As described above, when the plurality of laminates 111 are vertically laminated, as illustrated in FIG. 4, the processing space in which each of the substrates S is processed may be defined between the plurality of laminates 111. Thus, the space in which the process gas injected from the injection nozzle 141 is spread may be reduced, and the process gas may vertically move along the space between the plates 111a and then be guided to the substrate S. Thus, the process gas supplied to a side surface of the substrate S may come into contact with the side surface of the substrate S to move along the top and bottom surfaces of the substrate S. That is, the laminar flow of the process gas may be induced. Since the process gas flows in parallel to the top surface of the substrate S, the process gas may be uniformly supplied to the substrate S to form the thin film having the uniform thickness.

As illustrated in FIG. 6, at least a portion of protrusion parts 111c of a plurality of laminates 111' may have a different thickness. That is, a spaced distance between the plates 111a may be adjusted through the thickness of the protrusion part 111c so that the moving path of the process gas supplied into each of the processing space for the substrate S may vary in height or width.

Also, the plate 111a between a hollow part 111b of the plurality of laminates 111' and the exhaust hole 111e may have a different width in the vertical direction. That is, the protrusion part 111c or the plate 111a of the plurality of laminates 111' may be adjusted in thickness so that at least a portion of the portion through which the process gas is suctioned and the portion through which the process gas is exhausted has a different size in the vertical direction.

For example, an amount of process gas injected from the injection hole that is close to the process gas supply line 142 and the injection hole that is far away from the process gas supply line 142 among the injection holes defined in the injection nozzles 141 may vary in accordance with a pressure difference. Thus, the upper protrusion part 111c of the plurality of protrusion parts 111c, i.e., the protrusion part disposed at a position that is far away from the process gas supply line 142 may have a high height, and the lower protrusion part 111c, i.e., the protrusion part 111c that is close to the process gas supply line 142 may have a low height. Thus, a gap between the upper plates 111a may be greater than that between lower plates 111a.

That is, the gap between the upper plates 111a may increase so that a large amount of process gas is smoothly supplied, and the gap between the lower plates 111a may decrease so that an amount of supplied process gas is reduced. Thus, a uniform amount of process gas may be supplied to the upper substrate S and the lower substrate S within the tube assembly 110. However, an exemplary embodiment is not limited to a method for adjusting a thickness of each of the plates 111a. For example, the thickness of the plate 111a may be adjusted through various methods.

Also, the upper plate 111a of the plurality of plates 111a may increase in width, and the lower plate 111a may decrease in width to adjust a size of the portion through which the process gas introduced into the exhaust hole 111e passes.

Thus, the upper portion through which the process gas passes may increase in size so that the process gas smoothly moves to be injected into the exhaust hole 111e, and the lower portion through which the process gas passes may decrease in size so that an amount of process gas introduced into the exhaust hole 111e decreases. Thus, an amount of process gas increases at the upper side at which a relatively small amount of process gas is supplied due to the pressure difference, and an amount of process gas decreases at the lower side at which a relatively large amount of process gas is supplied. As a result, a uniform amount of process gas may be supplied into the whole region of the tube assembly 110. However, an exemplary embodiment is not limited to a method for adjusting a thickness of each of the plates 111a. For example, the thickness of the plate 111a may be adjusted through various methods.

Alternatively, as illustrated in FIG. 7, one or plurality of height adjustment member 115 may be provided between the plates 111a of the plurality of laminates 111c. The height adjustment members 115 may be disposed along the shape of the protrusion part 111c. Also, the fixing bar 113 in which a hole corresponding to the insertion part 111f of the protrusion part 111c is defined may be inserted into each of the height adjustment members 115. Thus, the height adjustment member 115 may be fixed between the protrusion parts 111c.

A distance between the plates 111a may be adjusted in accordance with the number of height adjustment members 115. That is, the more the number of height adjustment members 115 provided between the protrusion parts 111c increases, the more the distance between the plates 111a may increase. Also, the more the number of height adjustment members 115 decreases, the more the distance between the plates 111a may decrease. Thus, the distance between the plates 111a may be adjusted for each height to supply a uniform amount of process gas to the upper substrate S and the lower substrate S within the tube assembly 110.

A region may be classified in accordance with the height of the tube assembly 110 in order to reduce the difference between an injection amount of process gas and suction force of the exhaust hole 111e, and the distance between the plates 111a and the size of the exhaust hole 111e may be adjusted for each region. Thus, a uniform amount of process gas may be controlled to be supplied into and exhausted from the processing space for each substrate S within the tube assembly 110.

As described above, the plurality of laminates 111 may be laminated to provide a path through which the process gas moves in one direction. Therefore, the space in which the process gas is spread may be reduced to concentratedly supply the process gas to the substrate S. Thus, the amount of process gas supplied to the substrate S to actually participate in the substrate processing process may increase to reduce the waste of the process gas and improve the efficiency of the substrate processing process.

Also, the laminar flow of the process gas supplied to the substrate S may be induced. Therefore, the process gas may be supplied in parallel to the top surface of the substrate S and thus be uniformly supplied to the entire top surface of the substrate S. Thus, the thin film having the uniform thickness may be formed on the top surface of the substrate S to improve the quality of the thin film.

Figure 8:
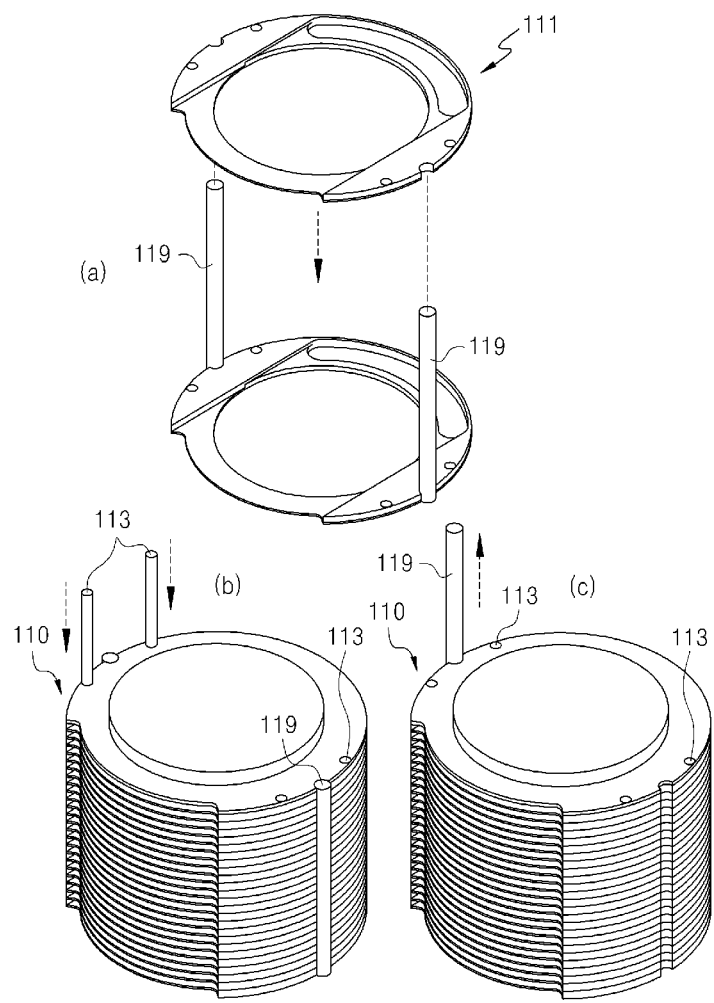
FIG. 8 is a view for explaining a process of assembling the tube assembly in accordance with an exemplary embodiment.

FIG. 8 is a view for explaining a process of assembling the tube assembly in accordance with an exemplary embodiment. Hereinafter, a method for assembling the tube assembly in accordance with an exemplary embodiment will be described.

Referring to FIG. 8, a method for assembling the tube assembly in accordance with an exemplary embodiment may be a method for assembling the tube assembly 110 having a space in which the plurality of substrates are processed. The method for assembling the tube assembly includes a process of inserting a plurality of laminates 111 into an alignment bar 119 extending in the vertical direction, a process of inserting the fixing bar 113 into the plurality of laminates 111, and a process of separating the alignment bar 119 from the laminates 111. Here, the alignment bar 119 may be softer than the laminate 111, and the fixing bar 113 may be harder than the alignment bar 119.

First, the alignment bar 119 extending in the vertical direction may be vertically erected. When the alignment bar 119 may be provided in one or more or provided in plurality, the alignment bars 119 may be disposed to be spaced apart from each other along the circumferential shape of the tube assembly 111.

Then, the plurality of laminates 111 are inserted one by one into the alignment bars 119. That is, when the tube assembly 110 is constituted by the plurality of laminates 111, if the laminates are not aligned with each other, a gap between the laminates 111 may occur. Thus, since the gas within the tube assembly is discharged to the outside, it is important that the plurality of laminates 111 are aligned and assembled at an accurate position. Thus, since the alignment bar 119 may be provided to insert the alignment bar 119 into the laminates 111, the plurality of laminates 111 may be stably assembled.

Here, the alignment bar 119 may be softer than the laminate 111. For example, the laminate 111 may be made of quartz, and the alignment bar 119 may be made of Teflon. Thus, since the alignment bar 119 is made of a soft material, while the laminate 111 is inserted, the laminate 111 made of a hard material may be suppressed or prevented from being broken or damaged. Also, the laminate 111 may be suppressed or prevented from being damaged during the assembly.

When all the laminates 111 are inserted into the alignment bar 119 and then completely assembled, one or plurality of fixing bars 113 may be inserted into the insertion parts provided in the laminates 111. The fixing bar 113 may be made of harder than that of the alignment bar 119. For example, the fixing bar 113 may be made of quartz that is the same material as the laminate 111. Thus, even when the substrate is processed in the tube assembly at a high temperature, since the fixing bar 113 and the laminate 111 have the same coefficient of thermal expansion, the fixing bar 113 and the laminate may be prevented from being damaged due to thermal expansion coefficients different from each other.

Then, the alignment bar 119 may be withdrawn and separated from the laminates 111. The substrate processing process is generally performed at a high temperature, and the alignment bar 119 made of a soft material may be vulnerable to heat. Thus, since the alignment bar 119 may be melted or damaged in the state of being inserted, the alignment bar 119 may be separated. That is, after the laminate 111 is assembled to be aligned with the alignment bar 119, the alignment bar 119 may be fixed by the fixing bar 113, and the alignment bar 119 may be withdrawn.

As described above, the tube assembly may be constituted by the plurality of laminates 111 to induce the laminar flow of the process gas supplied to the substrate S. Therefore, the process gas may be supplied in parallel to the top surface of the substrate S and thus be uniformly supplied to the entire top surface of the substrate S. Thus, the thin film having the uniform thickness may be formed on the top surface of the substrate S to improve the quality of the thin film.

In addition, the process gas may be uniformly supplied to the entire upper surface of the substrate S while reducing the spreading space of the process gas by the isolation plates 174 provided in the support unit 170 supporting the substrate 111, an amount of the process gas that is actually involved in the substrate processing process among the process gases supplied to the substrate S may increase. Therefore, waste of the process gas may be reduced, and the efficiency of the substrate processing process may be improved.

As described above, while this invention has been particularly shown and described with reference to preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:
1. A substrate processing apparatus comprising:
   a tube assembly having an inner space in which substrates are processed and assembled by laminating a plurality of laminates;
   a substrate holder configured to support a plurality of substrates in a multistage manner in the inner space of the tube assembly;

a gas supply unit installed on one side of the tube assembly to supply a process gas to each of the plurality of substrates in the inner space; and an exhaust unit connected to the tube assembly to exhaust the process gas supplied into the inner space;

wherein each of the laminates comprises:

a plate having a surface area;

a hollow part provided in a central portion of the plate so that the substrate holder is movable;

a protrusion part protruding from at least one of a first surface and a second surface, which face each other, on a portion of a circumference of the plate, and having a path through which the process gas is supplied; and a plurality of injection holes defined in an inner wall of the protrusion part to inject the process gas from both sides of the substrate, and communicating with the path within the protrusion part, wherein the process gas injected from the injection holes induces the flow of the process gas injected from the gas supply unit to the central portion of the substrate.

2. The substrate processing apparatus of claim 1, wherein, when the plurality of laminates are laminated, the protrusion parts support the plates so that the plates are spaced apart from each other.

3. The substrate processing apparatus of claim 2, wherein the gas supply unit is disposed on one side of the plate, and the protrusion parts comprise:

a pair of first protrusion members spaced apart from each other on both sides of the plate in a direction crossing an injection direction of the process gas to inject a flow of the process gas from one side to the other side of the plate; and a second protrusion member connected to the first protrusion members and disposed on the other side of the plate.

4. The substrate processing apparatus of claim 3, wherein each of the laminates further comprises an exhaust hole defined in the plate to exhaust the process gas between the hollow part and the second protrusion member, and the exhaust holes of the plurality of laminates are disposed in a line to provide a path through which the process gas is exhausted.

5. The substrate processing apparatus of claim 2, wherein a plurality of isolation plates configured to divide a processing space in which each of the substrates is processed are disposed on the substrate holder, and the isolation plates are disposed to correspond to the plate in a horizontal direction.

6. The substrate processing apparatus of claim 2, wherein an insertion part is provided in the protrusion part, and the tube assembly further comprises a fixing bar inserted into the insertion part to fix the laminates.

7. The substrate processing apparatus of claim 2, wherein at least a portion of the protrusion parts of the plurality of laminates has a different thickness.

8. The substrate processing apparatus of claim 2, wherein the tube assembly further comprises one or more height adjustment members installed between the protrusion parts of the plurality of laminates.

* * * * *